(12) United States Patent
Sekino et al.

(10) Patent No.: US 6,982,577 B2
(45) Date of Patent: Jan. 3, 2006

(54) POWER-ON RESET CIRCUIT

(75) Inventors: Yoshimasa Sekino, Tokyo (JP); Shoji Kitazawa, Tokyo (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 0 days.

(21) Appl. No.: 10/811,836

(22) Filed: Mar. 30, 2004

(65) Prior Publication Data
US 2005/0104635 A1 May 19, 2005

(30) Foreign Application Priority Data
Nov. 14, 2003 (JP) ............................. 2003-384523

(51) Int. Cl.
*H03L 17/22* (2006.01)

(52) U.S. Cl. ................................ 327/143
(58) Field of Classification Search ............ 327/143, 327/198
See application file for complete search history.

(56) References Cited

U.S. PATENT DOCUMENTS

| 5,528,182 | A | * | 6/1996 | Yokosawa | 327/143 |
| 5,898,327 | A | * | 4/1999 | Tanaka | 327/143 |
| 6,204,701 | B1 | * | 3/2001 | Tsay et al. | 327/143 |
| 6,335,646 | B1 | * | 1/2002 | Nagatomo | 327/143 |
| 2003/0058012 | A1 | * | 3/2003 | Matsushita | 327/143 |
| 2004/0239383 | A1 | * | 12/2004 | Kang | 327/143 |
| 2005/0057287 | A1 | * | 3/2005 | Gossmann | 327/143 |

FOREIGN PATENT DOCUMENTS

JP          10-163840           6/1998

* cited by examiner

*Primary Examiner*—Terry D. Cunningham
(74) *Attorney, Agent, or Firm*—Donasld R. Studebaker; Nixon Peabody, LLP

(57) ABSTRACT

A power-on reset circuit is capable of outputting a normal reset signal despite slow rise of power supply voltage. A node is interposed between a MOS capacitor including a PMOS with its drain and source connected in common and an NMOS having its gate fixedly connected to a ground potential. The node is connected to a ground potential via the NMOS and also to a power supply line via the MOS capacitor. Therefore, even when the power supply voltage rises slowly after power is turned on, the potential of the node rises substantially at the same rate as the power supply voltage. After the power supply voltage reaches a predetermined power supply potential, the potential of the node is gradually lowered due to an off leakage current through the NMOS. The node is connected with an inverter operating according to the power supply voltage. When the potential of the node decreases below ½ of the power supply voltage, the reset signal outputted from the inverter goes to the H level.

7 Claims, 4 Drawing Sheets

POWER-ON RESET CIRCUIT

BACKGROUND OF THE INVENTION

1. Field of the Invention

The present invention relates to a power-on reset circuit for generating a reset signal for initializing a system while being connected to a power source.

2. Related Art

As a conventional power-on reset circuit, there is a known one disclosed in Japanese Patent Kokai No.10-163840, for example. FIGS. 1A and 1B there in are diagrams explaining the power-on reset circuit. FIG. 1A shows a circuit configuration whereas FIG. 1B shows operation waveforms.

As shown in FIG. 1A, the power-on reset circuit includes N-channel MOS transistors 1, 2 (hereinafter, a MOS transistor will be referred to simply as MOS while an N-channel MOS will be referred to simply as NMOS) which are connected in series between a node NA and a ground potential GND. The NMOS s 1, 2 each have its gate connected to a power supply line 10 so as to be supplied with a power supply voltage VD. Connected between the node NA and the power supply line 10 is a MOS capacitor 3 utilizing capacitance between the gate and source/drain of a P-channel MOS (hereinafter, referred to as PMOS) Specifically, the gate of the PMOS is connected to the node NA whereas the source and drain thereof are connected to the power supply line 10.

On the other hand, the node NA is connected with an input of an inverter 4, the output of which is connected with a node NB. Connected between the node NB and a ground potential GND is a MOS capacitor 5 utilizing capacitance between the gate and source/drain of an NMOS. Specifically, the gate of the NMOS is connected to the node NB whereas the source and drain thereof are connected to a ground potential GND.

The node NB is further connected with inverters 6, 7 in cascade. A reset signal POR is outputted from the inverter 7 and applied to the circuit block to be reset. Although not shown in the figure, an arrangement is made such that the power supply voltage VD power source is supplied to the inverters 4, 6, 7 and the circuit block via the power supply line 10.

Next, operations of the power-on reset circuit will be described.

Prior to the power-on transition, the power supply voltage VD is at 0V and hence, the nodes NA, NB are at the ground potential GND so that the MOS capacitors 3, 5 store no electric charges. Therefore, the MOS capacitors 3, 5 each have a terminal-to-terminal voltage of 0V. When the power is applied at time t0 as shown in FIG. 1B, the power supply voltage VD on the power supply line 10 starts rising from 0V to a predetermined power supply potential VDD.

Immediately after the power is turned on, when the power supply voltage VD is below the threshold voltage VTN of the NMOS s 1, 2, these NMOS s 1, 2 are OFF and the node NA is connected to the power supply line 10 via the MOS capacitor 3 whose terminal-to-terminal voltage is 0V. Hence, by charge conservation, the potential VA of the node NA will be increased in the same manner as the power supply voltage VD.

At time t1 when the power supply voltage VD exceeds the threshold voltage VTN, the NMOSs 1, 2 have their gates connected to the power supply line 10 and so are turned ON. This permits a current to flow from the node NA to the ground potential GND via the NMOSs 1, 2. Accordingly, the subsequent fluctuation of the potential VA is greatly affected by the rate of increase of the power supply voltage VD, the on resistance (drive current capability) of the NMOSs 1, 2 and the capacity of the MOS capacitor 3. That is, if the power supply voltage VD rises fast, the MOS capacitor 3 has a large capacity and the NMOSs 1, 2 has large on resistances, the increase of potential VA follows closely the increase in the power supply voltage VD, albeit at a lower rate.

From time t2 when the power supply voltage VD reaches the predetermined power supply potential VDD, the potential VA exponentially falls in accordance with the time constant of the on resistance of the NMOSs 1, 2 and the time constants of the capacitance of NMOS 3.

At time t3 when the potential VA of the node NA decreases below ½ of the power supply voltage VD, the output signal from the inverter 4 connected with the node NA is shifted from L level to H level. Since the MOS capacitor 5 is connected between the node NB on the output side of the inverter 4 and the ground potential GND, the potential VB of the node NB rises from the ground potential GND to the power supply potential VDD in accordance with a given time constant.

At time t4 when the potential VB of the node NB rises to above ½ of the power supply voltage VD, the output from the inverter 6 connected with the node NB is inverted and the output from the inverter 7 connected in cascade with the inverter 6 is also inverted, thereafter applied as the reset signal POR to the circuit block.

However, the aforesaid power-on reset circuit has the preconditions that the power supply voltage VD rises fast, the MOS capacitor 3 has large capacity, and the on resistances of the NMOSs 1, 2 are large, so that the potential VA of the node NA continues to rise after the NMOSs 1, 2 are turned ON.

Hence, the following problem may be encountered in the following case. If when the power is turned on, the rise of the power supply voltage VD is slow, the potential VA of the node NA may rise very little or even start falling after the NMOSs 1, 2 are turned ON. In such cases, the node NA stays at L level from the start and remains unchanged, whereas the node NB stays at H level and remains unchanged. Therefore, the reset signal POR assumes H level from the start, disabling normal resetting operations.

To cope with this slow rise of the power supply voltage VD without changing circuit configuration, the gate lengths of the NMOSs 1, 2 need to be increased so as to increase the on resistances thereof, or to increase the gate area of the PMOS gate so as to increase the capacity of the MOS capacitor 3. This results in an undesirable increase in area of the circuit pattern.

It is an object of the invention to provide a power-on reset circuit capable of outputting a normal reset signal POR despite the slow rise of the power supply voltage VD.

SUMMARY OF THE INVENTION

According to a first aspect of the invention, the power-on reset circuit comprises: a capacitor connected between a power supply line and an internal node; a MOS transistor having its drain connected to the internal node and its source connected to a reference potential, and set in OFF state; and an output portion outputting a reset signal when the potential of the internal node decreases below the threshold voltage after the application of a power supply voltage to the power supply line.

According to a second aspect of the invention, the power-on reset circuit comprises: a first capacitor connected between a power supply line and a first node; a first MOS transistor which is ON/OFF controlled based on a first pulse signal and connected between the first node and a second node; a second MOS transistor which is ON/OFF controlled based on a second pulse signal and connected between the second node and a reference potential; a second capacitor connected between the second node and the reference potential; a timing control unit for generating the first and second pulse signals in synchronism with a clock signal externally applied thereto; and an output portion outputting a reset signal when the potential of the internal node decreases below a threshold voltage after the application of a power supply voltage to the power supply line.

According to the first aspect of the invention, the power-on reset circuit is configured so that the internal node is connected to the reference potential via an MOS normally set in the OFF state. This provides an effect that the circuit is capable of outputting a normal reset signal despite the slow rise of the power supply voltage because the internal node follows closely the change in power supply voltage.

According to the other aspect of the invention, the power-on reset circuit comprises a timing control unit providing ON/OFF control in synchronism with the clock signal, thereby switching ON or OFF the first and second MOSs serially connected between the first node and the reference potential. In addition to the advantage offered by the power-on reset circuit of the first aspect, an advantage is provided that the power-on reset signal synchronized with the clock signal can be outputted. These and other objects, and novel features of the invention will become fully apparent from the following description thereof taken in conjunction with the accompanying drawings which illustrate preferred embodiments of the invention. It is to be noted, however, that the drawings are for purposes of illustration only and do not limit the scope of the invention.

DETAILED DESCRIPTION OF THE PREFERRED EMBODIMENTS

Figure 1A:
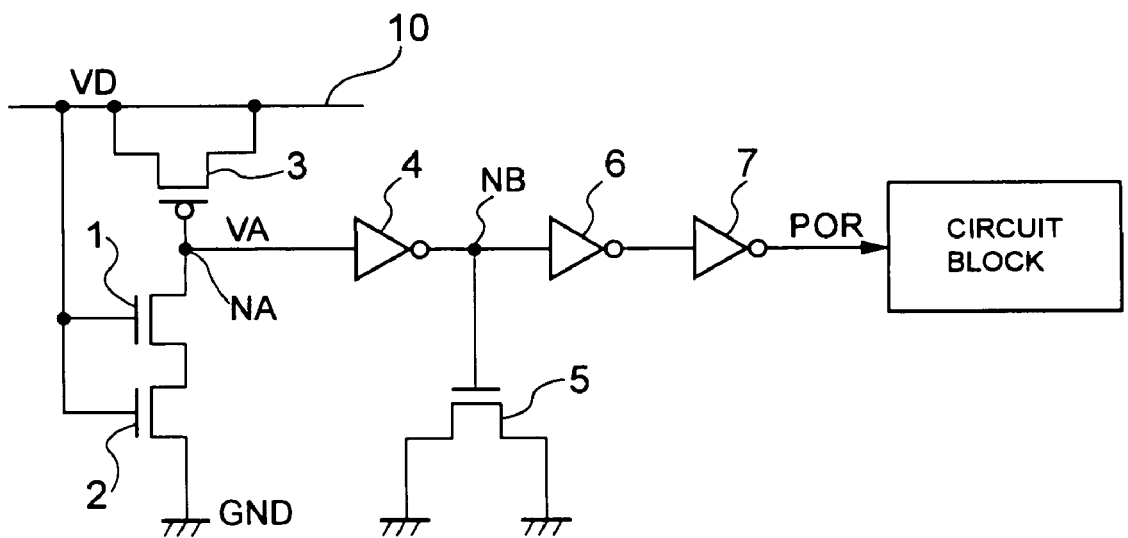
FIGS. 1A and 1B are diagrams illustrating a conventional power-on reset circuit.
Figure 1B:
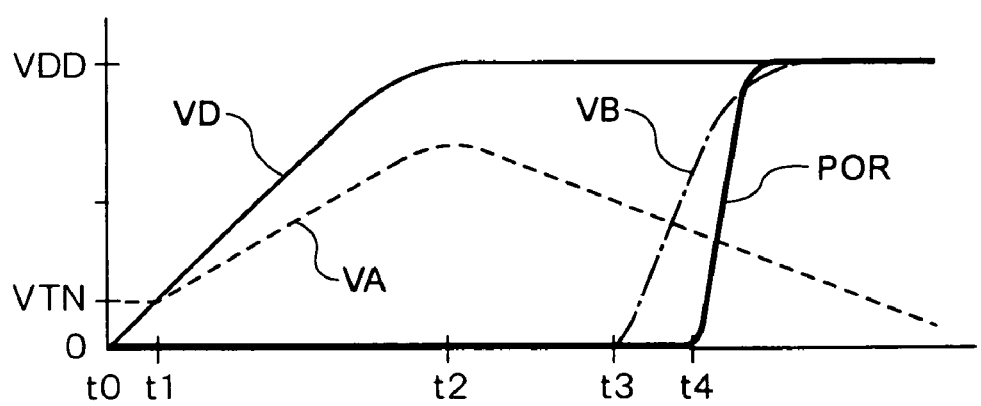
Figure 2A:
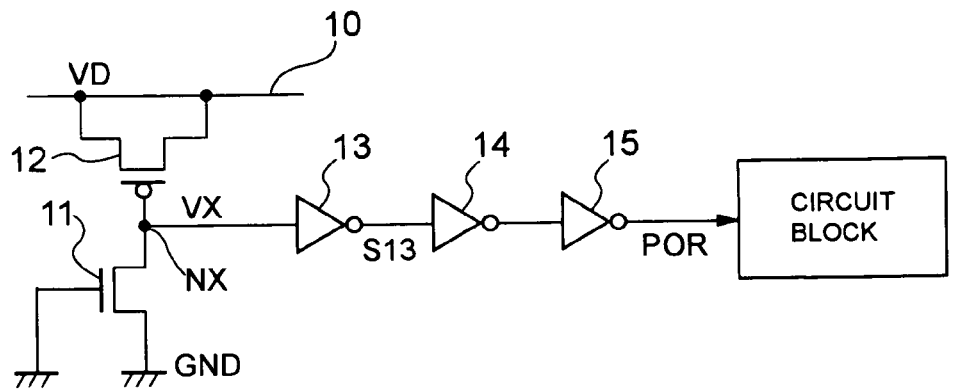
FIGS. 2A and 2B are diagrams illustrating a power-on reset circuit according to Example 1 of the invention.
Figure 2B:
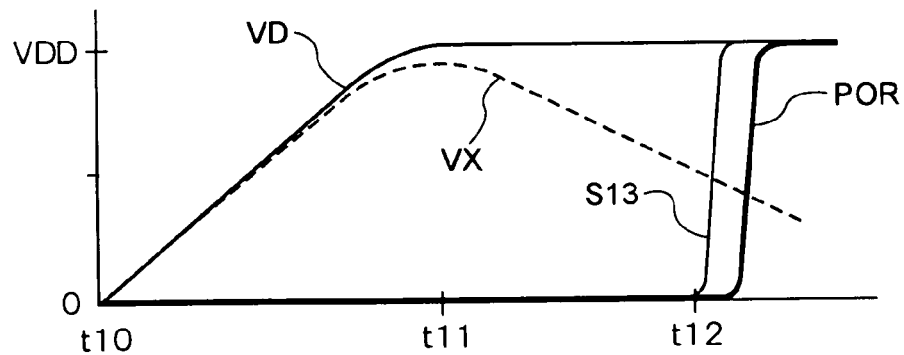

FIGS. 2A and 2B illustrate a power-on reset circuit according to Example 1 of the invention. FIG. 2A shows a circuit configuration whereas FIG. 2B shows operation waveforms.

As shown in FIG. 2A, the power-on reset circuit includes an NMOS 11 connected between a node NX and a ground potential GND. The NMOS 11 has its gate connected to the ground potential GND. Connected between the Node NX and a power supply line 10 is a MOS capacitor 12 utilizing capacitance between the gate and source/drain of a PMOS. Specifically, the PMOS has its gate connected to the node NX and its source and drain connected to the power supply line 10. The node NX is further connected with three inverter stages 13, 14, 15 in cascade. A reset signal POR is outputted from the final inverter stage 15, and applied to the circuit block to be reset. Although not shown in the figure, an arrangement is made so that a power supply voltage VD is supplied to the inverters 13–15 and the circuit block via the power supply line 10. Next, operations of the power-on reset circuit will be described.

Prior to turning on power, the power supply voltage VD is 0V and hence, a potential VX of the node NX is the ground potential GND so that no electric charge is stored in the MOS capacitor 12. Therefore, the MOS capacitor 12 has a terminal-to-terminal voltage of 0V. On the other hand, the NMOS 11 has its gate fixedly connected with the ground potential GND and hence, the NMOS 11 is in OFF state.

When the power is turned on at time t10 as shown in FIG. 2B, the power supply voltage VD on the power supply line 10 starts rising from 0V to a predetermined power supply potential VDD. Since the NMOS 11 is always in OFF state, no current except for a small leakage current (off leakage current) flows through the NMOS 11. The node NX is connected to the power supply line 10 via the MOS capacitor 12 with terminal-to-terminal voltage 0V. Hence, the potential VX of the node NX rises due to charge conservation just as the power supply voltage VD does.

The inverter 13 connected with the node NX is supplied with the power supply voltage VD. The input level of the inverter 13 is the potential VX which in turn is substantially equal to the power supply voltage VD. Hence, an output signal from the inverter 13 is at L level. Accordingly, the reset signal POR outputted from the inverter 15 is also at L level. Thus, the circuit block is set to an initial state.

At time t11 when the power supply voltage VD reaches the predetermined power supply potential VDD, the potential VX of the node NX also reaches a level substantially equal to the power supply potential VDD. Subsequently, the potential VX exponentially falls in accordance with a time constant determined by large off leakage resistance of the NMOS 11 and the MOS capacitor 12.

At time t12 when the potential VX of the node NX decreases below ½ of the power supply voltage VD, the output signal S13 from the inverter 13 connected with the node NX is shifted from L level to H level. Thus the output signal from the inverter 14 is inverted and so is the output signal from the inverter 15 connected in cascade with the inverter 14. Thus, the reset signal POR is shifted to H level and applied to the circuit block. This releases the circuit block from the initial state so that predetermined operations are started.

As described above, the power-on reset circuit of Example 1 is so configured as to provide timing to shift the reset signal POR from L level to H level in accordance with the time constant determined from the off-leakage resistance of the NMOS 11 and from the MOS capacitor 12. This leads to an advantage that despite slow rise of the power supply voltage VD, the power-on circuit is capable of outputting the normal reset signal POR without increasing the area of the circuit pattern.

Figure 3:
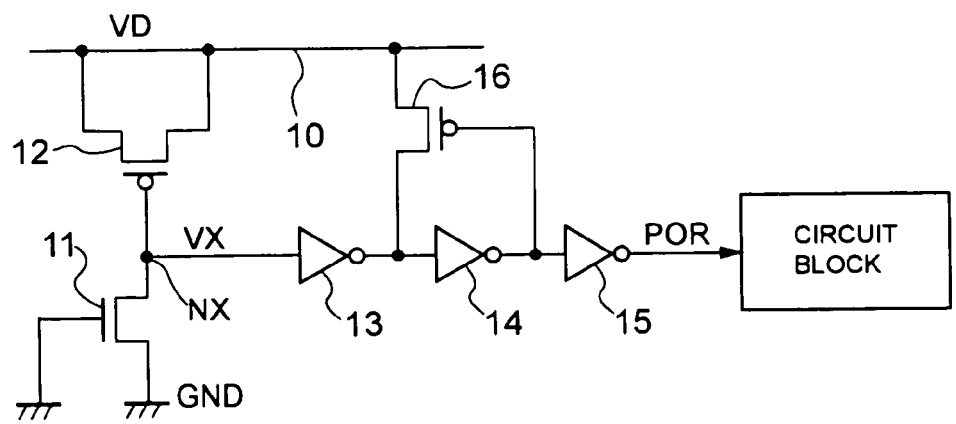
FIG. 3 is a circuit diagram illustrating a power-on reset circuit according to Example 2 of the invention.

FIG. 3 is a circuit diagram illustrating a power-on reset circuit according to Example 2 of the invention. In the figure, components similar to those shown in FIG. 2A are represented by the same reference characters, respectively.

The power-on reset circuit is characterized by imparting hysteresis to the output of the power-on reset circuit of FIG. 2A. Specifically, a PMOS 16 is added, and its drain, gate and source are connected to the output of the inverter 13 (or the input of the inverter 14), the output of the inverter 14 (or the input of the inverter 15) and the power supply line 10, respectively. Otherwise, the circuit is configured the same way as that of FIG. 2A. Since basic operations of the power-on reset circuit are the same as those illustrated in FIG. 2B, a detailed description thereof is dispensed with. In short, when the potential of the node NX decreases below the threshold voltage of the inverter 11, the output signal from the inverter 13 is shifted from L level to H level. Thus, the output signal from the inverter 14 is shifted from H level to L level so that PMOS 16 is turned ON.

At this time, the potential of the node NX is lower than the threshold voltage of the inverter 13, and thus is recognized as being at the L level. However, the potential of the node NX is not as low as the ground potential GND. On the other hand, the potential at the output of the inverter 13 is recognized as H level but is actually at an intermediate potential. Therefore, the inverter is in an instable condition. If, in this state, the PMOS 16 is turned ON, the inverter is increased in potential to be shifted to a stable H level because the input of the inverter 14 is connected with the power supply line 10 via the PMOS 16.

As described above, the power-on reset circuit of Example 2 includes the additional PMOS 16 for imparting the hysteresis characteristic to the output portion thereof. This leads to an advantage of preventing the reset signal POR from being affected by noises which may occur when the node NX is shifted from H level to L level. Thus, the circuit can accomplish more stable operations.

Figure 4A:
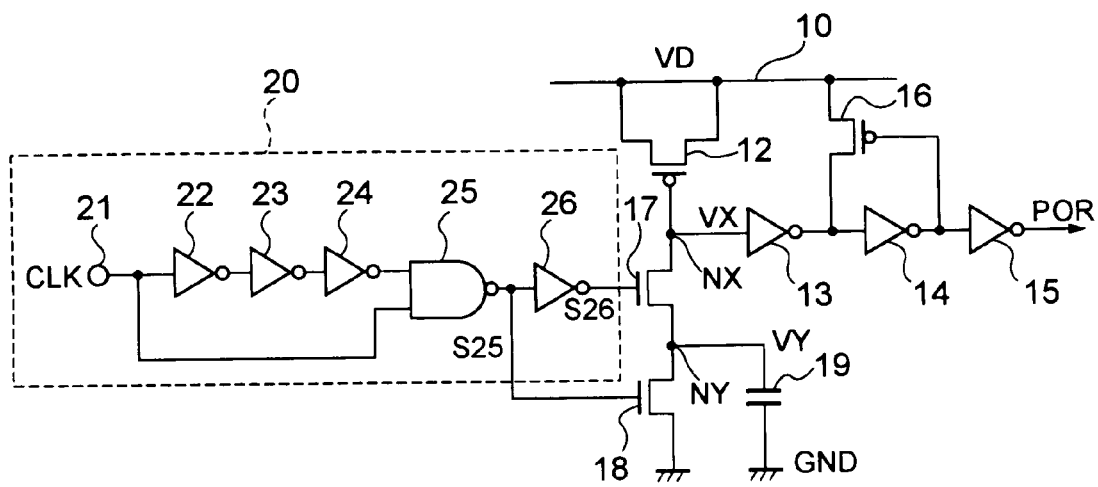
FIGS. 4A and 4B are diagrams illustrating a power-on reset circuit according to Example 3 of the invention.
Figure 4B:
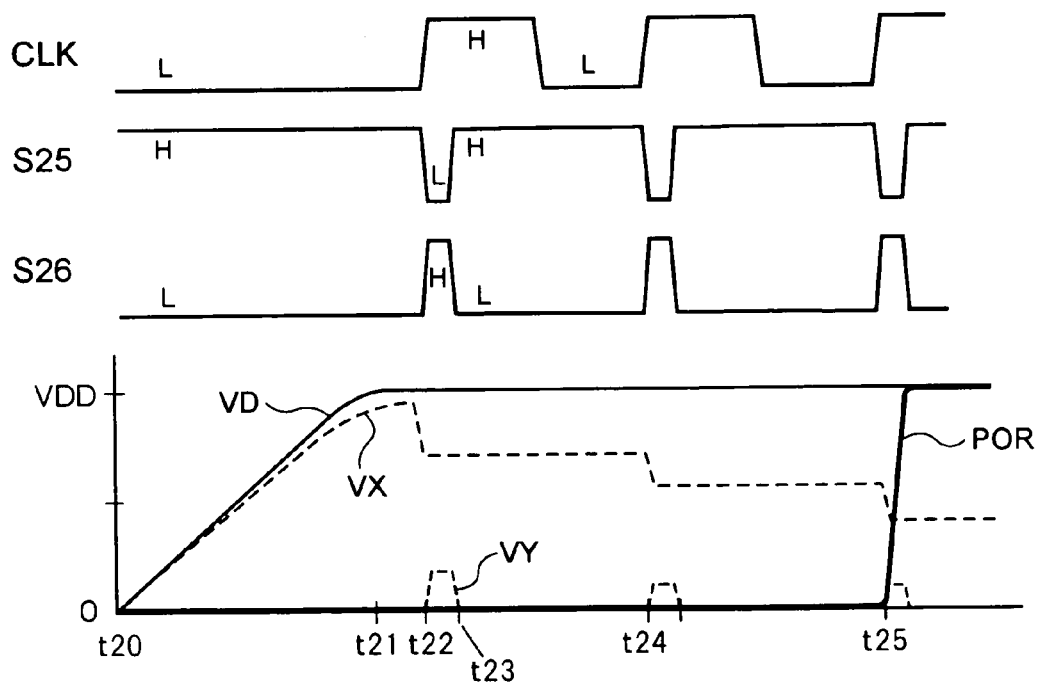

FIGS. 4A and 4B are diagrams illustrating a power-on reset circuit according to Example 3 of the invention. FIG. 4A shows a circuit configuration and FIG. 4B shows operation waveforms. In FIG. 4A, components similar to those shown in FIG. 3A are represented by the same reference characters, respectively.

The power-on reset circuit is adapted to generate a reset signal synchronized with a clock signal applied by an external device. As shown in FIG. 4A, the circuit includes series-connected NMOSs 17, 18 in place of the NMOS 11 shown in FIG. 3, and a timing control unit 20 for controlling these NMOSs 17, 18.

A capacitor 19 has one end connected to a junction point (node NY) between the source of the NMOS 17 and the drain of the NMOS 18. The other end of the capacitor 19 is connected to the ground potential GND. The timing control unit 20 has a terminal 21 to which a clock signal CLK is applied by the external device. Three inverter stages 22–24 are connected in cascade with the terminal 21. The final inverter stage 24 has its output connected to one of the two inputs of a NOT-AND gate 25 (hereinafter, referred to as NAND). The other input of the NAND 25 is connected to the terminal 21. A signal S25 outputted from the NAND 25 is applied to a gate of the NMOS 18 and also is inverted by the inverter 26 so as to be converted to a signal S26, which is applied to a gate of the NMOS 17.

When the clock signal CLK alternating between L level and H level with a given period is applied to the terminal 21, the timing control unit 20 outputs the pulse signals S25, S26 in synchronism with the rise of the clock signal CLK, the L level pulse signal S25 outputted during the delay time of the inverters 22–24, and the pulse signal S26 being an inverted version of the signal S25. Otherwise, the circuit is configured the same way as that of FIG. 3. Next, operations of the power-on reset circuit will be described.

When the power-on reset circuit is not supplied with the clock signal CLK (that is, fixed to L or H level), the signal S25 outputted from the NAND 25 of the timing control unit 20 is at H level whereas the signal S26 outputted from the inverter 26 is at L level. Accordingly, the NMOSs 17, 18 are in OFF state and in ON state, respectively, and hence, the same configuration as that of FIG. 3 is established so as to perform similar operations. When supplied with the clock signal CLK, the circuit operates as follows.

When the power is applied at time t20 as shown in FIG. 4B, the power supply voltage VD on the power supply line 10 starts rising from 0V to a predetermined power supply potential VDD. If the clock signal CLK is at L level when power is applied, the signals S25, S26 are at H level and L level, respectively, and hence, the NMOSs 17, 18 are in OFF state and in ON state, respectively. Therefore, no current except for a small leakage current (off leakage current) flows through the NMOS 17.

The node NX is connected to the power supply line 10 via the MOS capacitor 12 having terminal-to-terminal voltage of 0V. Hence, the potential VX of the node NX rises due to charge conservation the same way as the power supply voltage VD does. On the other hand, the NMOS 18 is in ON state so that a potential VY of the node NY is substantially equal to the ground potential GND.

At time t21 when the power supply voltage VD reaches a predetermined power supply potential VDD, the potential VX of the node NX also reaches a level substantially equal to the power supply potential VDD. Subsequently, the potential VX exponentially falls in accordance with a large time constant determined from the large off leakage resistance of the NMOS 11 and from the MOS capacitor 12. However, the drop in potential is extremely slow.

At time t22 when the clock signal CLK rises, the signals S25, S26 outputted from the timing control unit 20 assume L level and H level for a given time period, respectively. This brings the NMOS 17 into ON state and the NMOS 18 into OFF state. Consequently, the node NX shares the electric charge with the capacitor 19 connected to the node NY via the NMOS 17. The potential VX of the node NX quickly falls in correspondence to the amount allocated to the capacitor 19 whereas the potential VY of the node NY rises correspondingly.

At time t23 when the signals S25, S26 are returned to H level and L level, respectively, the NMOS 17 is turned OFF while the NMOS 18 is turned ON. Thus, the node NX is isolated from the node NY. On the other hand, the capacitor 19 is discharged via the NMOS 18 so that the potential VY of the node NY is decreased to the ground potential GND.

At each rise of the clock signal CLK at time t24, t25, the same operations as those performed at time t22 are repeated so that the potential VX of the node NX is decreased stepwise. At time t25 when the potential VX decreases below ½ of the power supply voltage VD, for example, the output signal from the inverter 13 connected to the node NX is shifted from L level to H level, thereby shifting the reset signal POR to H level. The number of clock cycles until the potential VX of the node NX decreases less than the threshold value of the inverter 13 can be set by adjusting the capacitance ratio between the MOS capacitor 12 and the capacitor 19. As described above, the power-on reset circuit of Example 3 includes the timing control unit 20 for providing ON/OFF control of the NMOSs 17, 18 in synchronism with the clock signal CLK externally applied thereto. This permits the potential VX of the node NX to be decreased stepwise according to a given period. In addition to the advantage offered by Example 2, there is further provided an advantage of outputting the reset signal POR synchronized with the clock signal CLK.

The timing control unit 20 of Example 3 is adapted to turn ON/OFF the NMOSs 17, 18 with the same timing. This involves the following potential fear. In some timings, the NMOSs 17, 18 may be brought into a temporary ON state at the same time, connecting the node NX to the ground potential GND. Consequently, the timing control unit may not be able to provide the programmed timing. Example 4 eliminates such a fear.

Figure 5A:
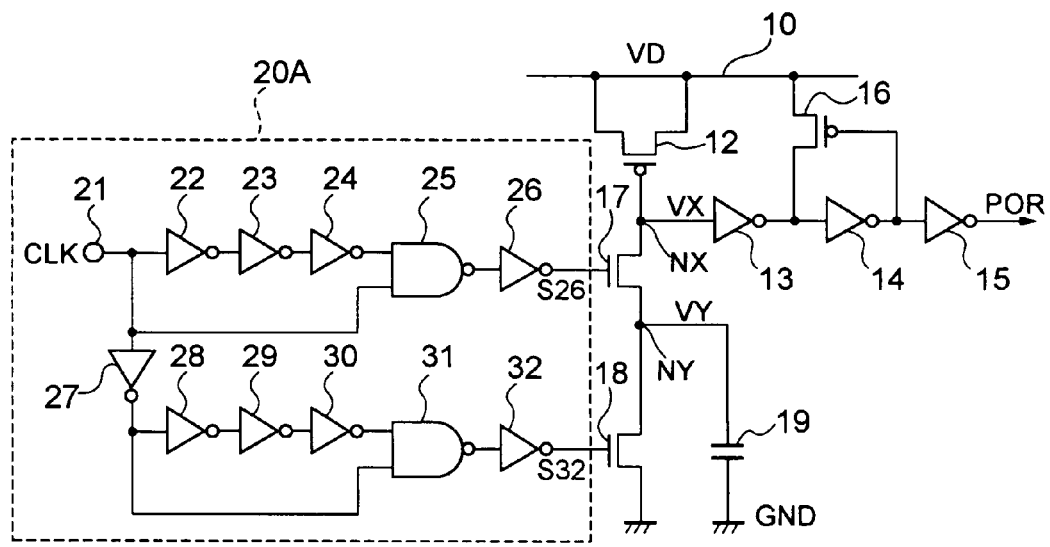
FIGS. 5A and 5B are diagrams illustrating a power-on reset circuit according to Example 4 of the invention.
Figure 5B:
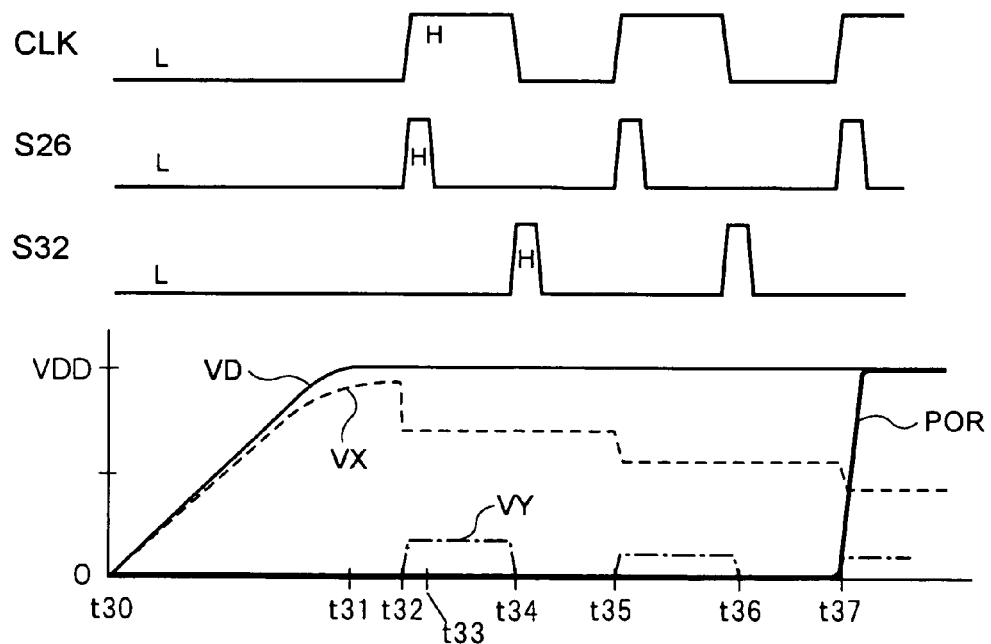

FIGS. 5A and 5B are diagrams illustrating a power-on reset circuit according to Example 4 of the invention. FIG. 5A shows a circuit configuration whereas FIG. 5B shows operation waveforms. In FIG. 5A, components similar to those shown in FIG. 4A are represented by the same reference characters, respectively.

As shown in FIG. 5A, the power-on reset circuit is configured the same way as the power-on reset circuit of FIG. 4A, except that the timing control unit 20 of FIG. 4A is replaced by a timing control unit 20A having a somewhat different configuration from the above.

The timing control unit 20A further includes inverters 27–30, 32 and a NAND 31 in addition to the terminal 21, inverters 22–24, 26 and NAND 25 employed by the timing control unit 20.

Specifically, the terminal 21 is connected with the inverter 27 for inverting the clock signal CLK. The inverter 27 has its output connected to one of the input terminals of the NAND 31 via the three inverter stages 28–30 connected in cascade, and connected directly to the other input terminal of the NAND 31. The output of the NAND 31 is connected with the inverter 32, which outputs a signal S32 to the gate of the NMOS 18. Next, operations of the power-on reset circuit will be described.

When the power-on reset circuit is not supplied with the clock signal CLK, both the signals S26, S32 outputted from the inverters 26, 32 of the timing control unit 20A are at L level. Therefore, both the NMOSs 17, 18 are in OFF state so that the same operations as those shown in FIG. 3 are carried out.

When the clock signal CLK is applied, the operations are performed as follows.

When the power is applied at time t30 as shown in FIG. 5B, the power supply voltage VD on the power supply line 10 starts rising from 0V to a predetermined potential VDD. If the clock signal is at L level when power is turned on, both the signals S26, S32 are at L level. Hence, both the NMOSs 17, 18 are in OFF state so that no current except for a small leakage current flows therethrough. Since the node NX is connected to the power supply line 10 via the MOS capacitor 12 having a terminal-to-terminal voltage of 0V, the potential VX of the node NX rises in almost the same way as the power supply voltage VD.

At time t31 when the power supply voltage VD reaches the predetermined power supply potential VDD, the potential VX of the node NX also reaches a level substantially equal to the power supply potential VDD.

At time t32 when the clock signal CLK rises, the signal S26 outputted from the timing control unit 20A is at H level for a limited period of time. This causes the NMOS 17 to be ON whereas the NMOS 18 stays in OFF state. Consequently, the node NX shares the electric charges with the capacitor 19 connected to the node NY via the NMOS 17. Hence, the potential VX of the node NX quickly falls in correspondence to the amount allocated to the capacitor 19 whereas the potential VY of the node NY rises correspondingly.

At time t33 when the signal S26 is returned to L level, the NMOS 17 is turned OFF so that the node NX is isolated from the node NY.

At time t34 when the clock signal CLK falls, the signal S32 outputted from the timing control unit 20A assumes H level for a limited period of time. This switches ON the NMOS 18 whereas the NMOS 17 stays in OFF state. Consequently, the capacitor 19 is discharged via the NMOS 18 so that the potential VY of the node NY is decreased to the ground potential GND.

At each rise of the clock signal CLK at times t35, t37, the same operations as those performed at time t32 are repeated so that the potential VX of the node NX is lowered stepwise. At each drop of the clock signal CLK at time t36, the same operations as those performed at time t34 are repeated, and the capacitor 19 is discharged.

At a rise of the clock signal CLK such as time t37 when the potential VX decreases below ½ of the power supply voltage VD, for example, the output signal from the inverter 13 connected to the node NX is shifted from L level to H level, thereby shifting the reset signal POR to H level.

As described above, the power-on reset circuit of Example 4 includes the timing control unit 20A which provides control to turn ON the NMOS 17 for a limited period of time in synchronism with the rise of the externally supplied clock signal CLK, and to turn ON the NMOS 18 for a limited period of time in synchronism with the fall of the clock signal CLK. Thus, the NMOSs 17, 18 are prevented from being turned ON at the same time so that the fear of bringing the node NX into connection with the ground potential GND is eliminated. In addition to the advantages offered by Example 3, there is further provided an advantage of ensuring stable operations according to design.

It is to be understood that the foregoing examples are mere illustrative examples for clarifying the technical details of the invention. The invention should not be construed in a narrow sense limited to the foregoing examples but various changes or modifications may be made thereto within a scope of the invention defined by the appended claims. Examples of the modification include as follows:

(a) The MOS capacitor 12 based on PMOS is connected between the power supply line 10 and the node NX. However, the device so connected is not limited to the MOS capacitor and any capacitor is applicable.

(b) While the output portion for the reset signal POR consists of the three inverter stages 13–15, the configuration of the output portion is not limited to this.

(c) Although the delay circuit of the timing control unit 20, 20A is constituted by the three inverter stages, the number of inverter stages is optional. Furthermore, an alternative delay circuit may be used. That is, any circuit configuration that is capable of generating a pulse signal synchronized with the clock signal may be applied the same way.

This application is based on Japanese Patent Application No. 2003-384523 which is herein incorporated by reference.

What is claimed is:

1. A power-on reset circuit comprising:
a first capacitor connected between a power supply line and a first node;
a first MOS transistor connected between said first node and a second node, and ON/OFF controlled based on a first pulse signal;
a second MOS transistor connected between said second node and a reference potential, and ON/OFF controlled based on a second pulse signal;
a second capacitor connected between said second node and said reference potential;
a timing control unit for generating said first and second pulse signals in synchronism with a clock signal externally applied thereto; and
an output portion outputting a reset signal when the potential of an internal node decreases below a threshold voltage after the application of a power supply voltage to said power supply line.

2. A power-on reset circuit according to claim 1, wherein said first MOS transistor is designed to be OFF when said first pulse signal is not applied thereto and to go ON with said first pulse signal applied thereto, and wherein said second MOS transistor is designed to be OFF when said second pulse signal is not applied thereto and to go ON with said second pulse signal applied thereto.

3. A power-on reset circuit according to claim 1, wherein said timing control unit outputs said first pulse signal when the clock signal externally applied thereto is shifted from a first logical level to a second logical level, and outputs said second pulse signal when the clock signal is shifted from the second logical level to the first logical level.

4. A power-on reset circuit according to claim 2, wherein said timing control unit outputs said first pulse signal when the clock signal externally applied thereto is shifted from a first logical level to a second logical level, and outputs said second pulse signal when the clock signal is shifted from the second logical level to the first logical level.

5. A power-on reset circuit according to any one of claims 1, 2, 3 and 4, wherein said first capacitor is a MOS capacitor comprising a MOS transistor having its source and drain connected to said power supply line and its gate connected to said internal node.

6. A power-on reset circuit according to any one of claims 1 to 4, wherein said output portion has a hysteresis characteristic.

7. A power-on reset circuit according to claim 5, wherein said output portion has a hysteresis characteristic.

* * * * *